United States Patent [19]
Hanson

[11] Patent Number: 4,833,421
[45] Date of Patent: May 23, 1989

[54] FAST ONE OUT OF MANY DIFFERENTIAL MULTIPLEXER

[75] Inventor: Charles W. Hanson, Milton, Vt.

[73] Assignee: International Business Machines Corporation, Armonk, N.Y.

[21] Appl. No.: 110,234

[22] Filed: Oct. 19, 1987

[51] Int. Cl.⁴ .......................... H03F 3/45; H03F 1/02; H03K 17/56
[52] U.S. Cl. ......................................... 330/252; 330/9
[58] Field of Search ................... 330/9, 252, 260, 261, 330/; 307/255, 355, 243

[56] References Cited

U.S. PATENT DOCUMENTS

| | | | |
|---|---|---|---|
| 3,422,283 | 1/1969 | Murray et al. | 307/207 |
| 3,489,923 | 1/1970 | Dahele | 307/241 |
| 3,686,512 | 8/1972 | Kroos | 307/218 |
| 3,800,245 | 3/1974 | Basu | 332/9 T |
| 3,925,691 | 12/1975 | Gaskill | 307/300 |
| 4,284,912 | 8/1981 | Fujisaki et al. | 307/255 |
| 4,626,709 | 12/1986 | Mazumder | 307/455 |

OTHER PUBLICATIONS

Signetics Analog Applications Manual, published in 1979, p. 184.

Primary Examiner—Gene Wan
Attorney, Agent, or Firm—Francis J. Thornton

[57] ABSTRACT

This is a one of the many differential multiplier circuits providing a fast selection of a one set of differential input signals from a multiplexity of differential input signals in which a plurality of differential input circuits coupled to differential outputs can be selectively prevented from being propagated to the differential outputs by activating one or more switching circuits coupled to the differential output circuits.

7 Claims, 3 Drawing Sheets

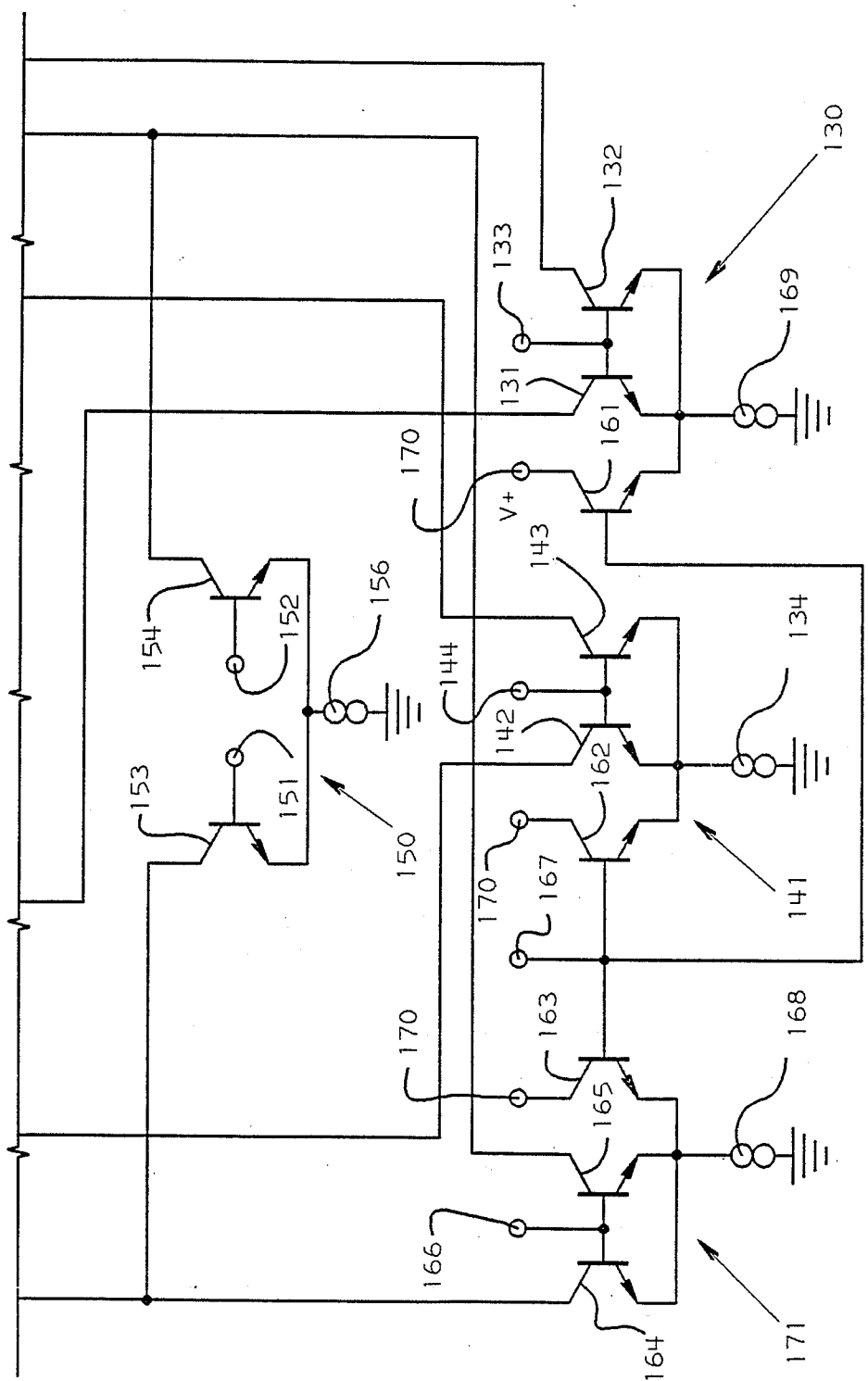

FAST ONE OUT OF MANY DIFFERENTIAL MULTIPLEXER

DESCRIPTION OF THE INVENTION

This invention relates generally to switching circuits for differential amplifiers and more particularly to a differential multiplexer circuit which provides a fast selection of one set out of many sets of deferential signals at common differential output ports.

DESCRIPTION OF THE PRIOR ART

One example of a switching circuit for a differential amplifier has been taught in U.S. Pat. No. 4,284,912. This patent describes a switching arrangement for a differential amplifier in which first and second sets of emitter coupled transistors of different conductivity types are connected to a common output so that by applying a switching signal to the base electrodes of the one set of transistors the differential output signals produced by the other set of transistors are switched to or from the circuit output.

The switching arrangement taught by this patent leads to considerable difficulties when integrating the devices in that both pnp and npn transistors must be provided for in the same silicon area. This increases the cost as well as the difficulty in manufacturing such integrated circuits.

Additionally, the circuit arrangement shown in this prior art patent is suitable only for switching a single differential amplifier on or off.

The present invention avoids all the difficulties of the above referenced prior art and in addition provides high performance multiplexing in analog digital circuits.

The present invention provides for the fast selection of different differential signals at a common output while providing isolation between the switching and input signals. The present invention thus facilitates switching high frequency signals easily and repetitively.

The present invention further provides for a low impedance drive and readily adapts itself to a multiplexer arrangement where one input set, of many sets, can be selected.

SUMMARY OF THE INVENTION

According to the present invention there is provided a one out of many differential multiplexer circuit providing a fast selection of one set of differential input signals from a multiplicity of sets of differential input signals. In the present invention a plurality of differential input circuits coupled to a differential output circuit can be selectively prevented from being propagated to the output circuits by actuating one or more switching circuits coupled to the outputs of the differential input circuits thus providing high speed and low impedance.

DESCRIPTION OF THE DRAWINGS

FIGS. 2a and 2b are a schematic of a differential multiplier circuit of the present invention in which one out of three differential input signals is selected and is supplied to the differential multiplier circuit of the present invention.

DESCRIPTION OF THE PREFERRED EMBODIMENT

Figure 1:
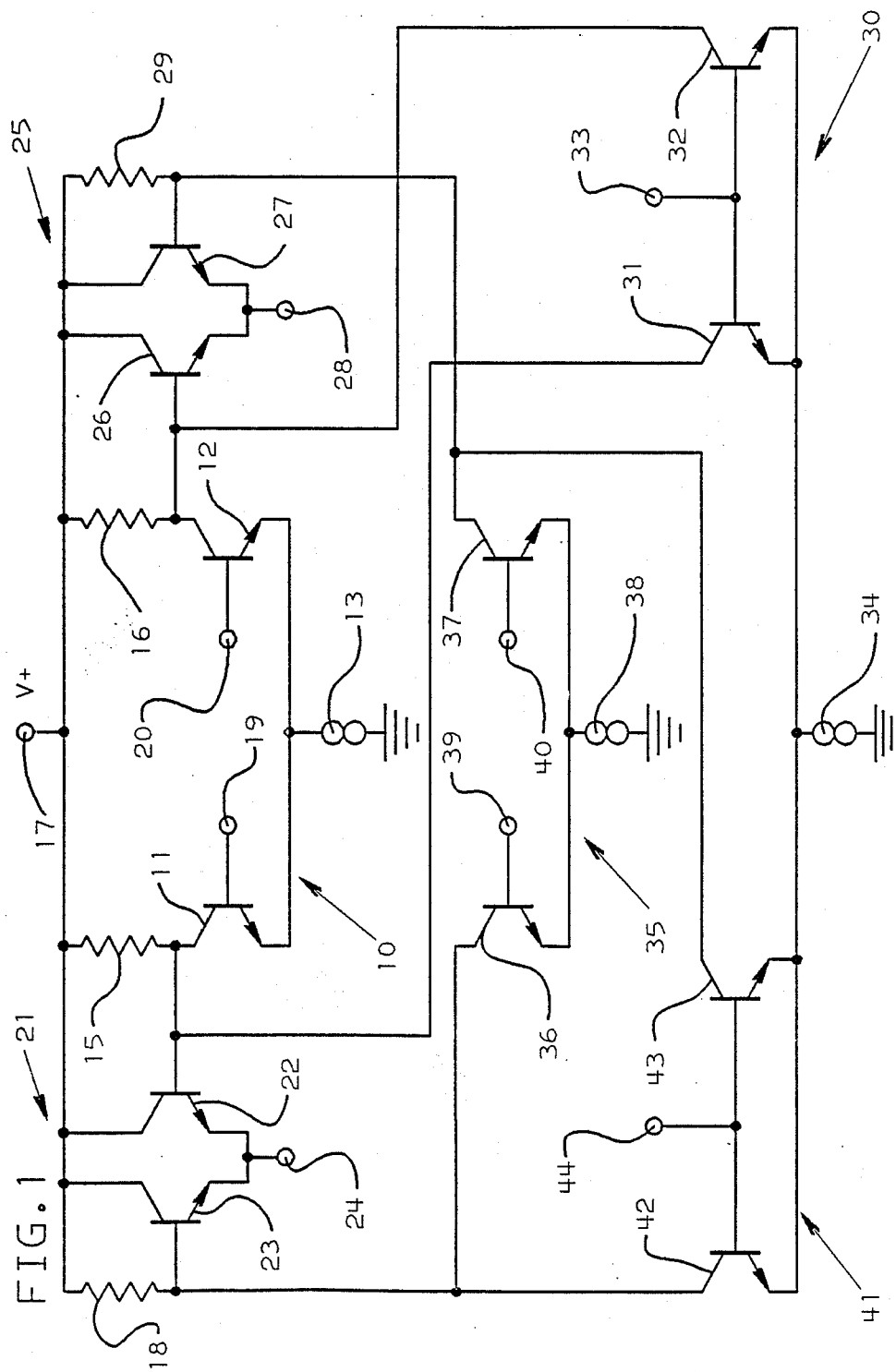
FIG. 1 is a schematic of a differential multiplier circuit of the present invention in which one of the two differential input signals is selected and supplied to the output.

In the preferred embodiment of the invention, shown in FIG. 1, there is provided a first differential input circuit 10, comprised of a pair of npn signal input transistors 11 and 12, having their emitters coupled in common through a current source 13 to ground. The collectors of these input transistors 11 and 12 are coupled through respective resistors 15 and 16 to an input voltage source 17. The bases of these transistors 11 and 12 are respectively coupled to a first set of input signal means 19 and 20.

At the junction between the collector of transistor 11 and resistor 15 there is coupled a first differential output circuit 21 which is comprised of output transistors 22 and 23 whose emitters are coupled in common and to an output 24. The base of output transistor 223 is coupled through resistor 18 to voltage source 17 while the collectors of both output transistor 22 and 23 are also connected to the voltage source 17. The base of transistor 22 is connected to the juncture of transistor 11 and resistor 15.

Similarly at the junction between transistor 12 and resistor 16 there is a connection leading to a second differential output circuit 25 which is comprised of output transistors 26 and 27 and whose emitters of which are coupled in common to an output 28. The base of transistor 27 is coupled to the voltage source 17 via resistor 29 and the collectors of both transistors 26 and 27 are connected to the voltage source 17. The base of transistor 26 is connected to the juncture of transistor 12 and resistor 16.

The base of output transistor 22 in the first differential output circuit 21 is also coupled through a switching transistor 31, in a first emitter coupled switching circuit 30, and a current source 34 to ground. The base of output transistor 26 in the second differential output circuit 25 is connected through a second switching transistor 32, in the emitter coupled current switching circuit 30, and the current source 34 to ground. The bases of both these switching transistors 31 and 32 are connected together and to a reference voltage source 33.

The bases of output transistors 23 and 27 are coupled to a second differential input circuit 35 and a second emitter coupled switching circuit 41. Specifically, the base of transistor 23 is coupled through input transistor 36 in the second differential input circuit 35 and a current source 38 to ground and through transistor 42 in the second switching circuit 41 and the current source 34 to ground. In like manner the base of transistor 27 in the second output circuit is coupled to ground through the input transistor 37 and the current source 38 and through transistor 43 and current source 34. The bases of transistors 36 and 37 are respectively coupled to a second set of input signal means 39 and 40. The bases of transistors 42 and 43 are coupled together and to a select signal source 44.

The above described circuit operates as follows. It is assumed that the differential input circuit 10 is to be selected. This means any signals introduced from signal means 19 and 20 are to be transmitted to and replicated at the outputs 24 and 28 respectively and the signals from signal means 39 and 40 of the second input differential circuit 35 are to be prevented from appearing at the outputs 24 and 28. To achieve this, the select signal source 44 on the second switching circuit 41 is raised, by suitable means, to a voltage higher than the voltage of the voltage reference source 33. This causes transistors 31 and 32 in circuit 30 to turn off and the transistors 42 and 43 in circuit 41 to turn on. When this occurs the current flowing through the current source 34 switches from circuit 30 and now begins to flow through transistors 42 and 43 (circuit 41). The currents flowing through these transistors 42 and 43 also flow through resistors 18 and 29 which lowers the potential at the bases of transistors 23 and 27 and at the collectors of transistors 36 and 37. This causes transistors 23 and 27 to turn off. Simultaneously with the turning off of transistors 31 and 32 any differential signal set applied to the bases of transistors 11 and 12 from signal input means 19 and 20 respectively is replicated at the outputs 24 and 28. If it is assumed that the signal from signal source 19 is high, transistor 11 turns on pulling down the base of transistor 22 and causing the emitter of transistor 22, connected to the output 24, to also go low, thusly inversely replicating the low level of the signal from source 19. Simultaneously, if the input signal from source 20 is low the transistor 12 turns off causing the voltage at the base of transistor 26 to rise and transistor 26 turns on causing the output 28 to rise towards voltage source 17 and thus inversely replicating at the output 28 the high level of the signal from source 20. In this way the differential signal set supplied to the differential input circuit 10 is replicated at the outputs of the multiplexer (i.e., outputs 24 and 28).

When it is desired that the differential input signal set supplied to the second differential input source 35 is to appear at the output nodes 24 and 28 the following sequence occurs. The select signal source 44 is brought below the voltage reference source 33 causing the current passing through the current source 34 to flow through transistors 31 and 32 respectfully and through the respective resistors 15 and 16. This lowers the potential at the bases of transistors 22 and 26 respectfully causing these transistors to turn off. When transistors 22 and 26 turn off they prevent any differential input signals applied by sources 19 and 20 from appearing at the outputs 24 and 28.

If, simultaneously, a differential input signal set from sources 39 and 40 (i.e., source 39 is high and source 40 low) is applied to the differential input transistors 36 and 37, the emitter of transistor 23 goes low and the emitter of transistor 27 goes high causing node 24 to go low and node 28 to go high. Thus nodes 24 and 28 replicate the set of differential input signals applied by sources 40 and 39. In this way the different differential input signal sets applied to the different differential input circuits 10 and 35 can be selectively propagated to the outputs 24 and 28.

Figure 2A:
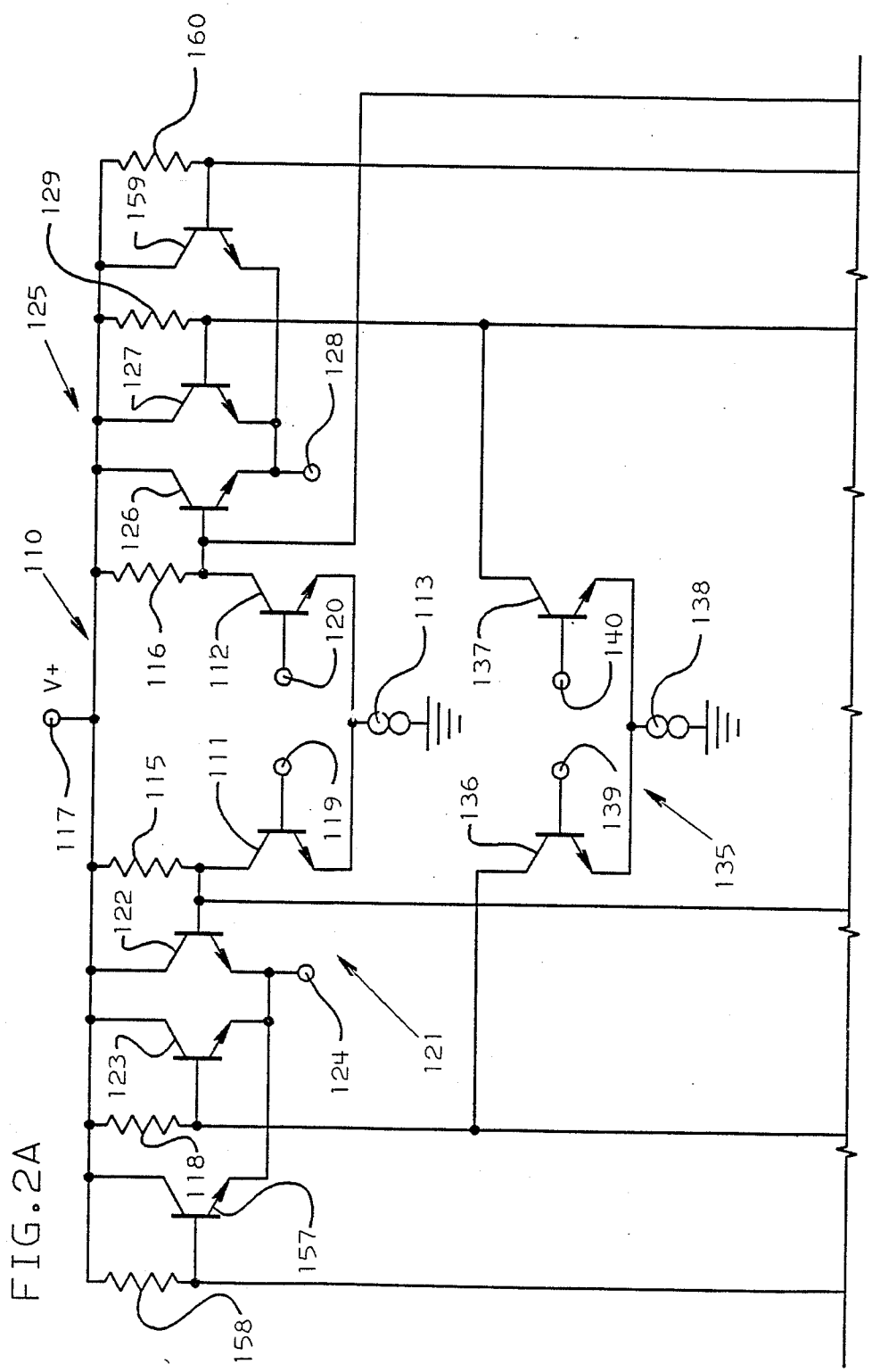

FIGS. 2a and 2b are a schematic of a differential multiplier circuit of the present invention in which one out of three differential input signals is selected.

Shown in FIGS. 2a and 2b, there is provided a first differential input circuit 110, comprised of a pair of npn signal input transistors 111 and 112, having their emitters coupled in common through a current source 113 to ground. The collectors of these input transistors 111 and 112 are coupled through respective resistors 115 and 116 to an input voltage source 117. The bases of these transistors 111 and 112 are respectively coupled to a first set of input signal means 119 and 120.

At the junction between the collector of transistor 111 and resistor 115 there is coupled a first differential output circuit 121 which is comprised of output transistors 122, 123 and 157 whose emitters are coupled in common and to an output 124. The base of output transistor 123 is coupled through resistor 118 to voltage source 117 and the base of transistor 157 is coupled through a resistor 158 to voltage source 117. The collectors of all the output transistors 122, 123 and 157 are also connected to the voltage source 117. The base of transistor 122 is connected to the juncture of transistor 111 and resistor 115.

Similarly, at the junction between transistor 112 and resistor 116 there is a connection leading to a second differential output circuit 125 which is comprised of output transistors 126, 127 and 159 and whose emitters of which are coupled in common to an output 128. The bases of transistors 127 and 159 are coupled to the voltage source 117 via respective resistors 129 and 160 and the collectors of all the transistors 126, 127 and 159 are connected to the voltage source 117. The base of transistor 126 is connected to the juncture of transistor 112 and resistor 116.

The base of output transistor 122 in the first differential output circuit 121 is also coupled through a switching transistor 131, in a first emitter coupled switching circuit 130, and a current source 169 to ground. The base of output transistor 126 in the second differential output circuit 125 is connected through a second switching transistor 132, in the emitter coupled current switching circuit 130, and the current source 169 to ground. The bases of both these switching transistors 131 and 132 are connected together and to a first select signal source 133.

The bases of output transistors 123 and 127 are coupled to a second differential input circuit 135 and a second emitter coupled switching circuit 141. Specifically, the base of transistor 123 is coupled through input transistor 136 in the second differential input circuit 135 and a current source 138 to ground and through transistor 142, in the second switching circuit 141, and the current source 134 to ground. In like manner the base of transistor 127 in the second output circuit is coupled to ground through the input transistor 137 and the current source 138 and through transistor 143 and current source 134. The bases of transistors 136 and 137 are respectively coupled to second set of input signal means 139 and 140. The bases of transistors 142 and 143 are coupled together and to a second select signal source 144.

The bases of output transistors 157 and 159 in output circuits 121 and 125 are coupled to a third differential input circuit 150 and a third emitter coupled switching circuit 171. Specifically, the base of transistor 157 is coupled through resistor 158 to voltage source 117 and through input transistor 153 in the third differential input circuit 150 and a current source 156 to ground and through transistor 164 in the third switching circuit 169 and a current source 168 to ground. In like manner the base of transistor 159 in the second output circuit 125 is coupled to ground through the input transistor 154 an the current source 156 and through transistor 165 and current source 168. The bases of transistors 153 and 154 are respectively coupled to a third set of input signal means 151 and 152. The bases of transistors 164 and 165 are coupled together and to a third select signal source 166.

It should be noted that each of the emitter coupled switching circuits 130, 141 and 171 are provided with respective third transistors 161, 162 and 163. Thus, the emitter of transistor 161 is coupled to current source 169, the emitter of transistor 162 is coupled to current source 134 and the emitter of transistor 163 is coupled to current source 168. The bases of these three transistors 161, 162 and 163 are all coupled in common and to a reference voltage source 167 and their collectors coupled to a voltage means 170.

The above described circuit operates as follows. It is assumed that the differential input circuit 110 is to be selected. This means the signals introduced from signal means 119 and 120 are to be transmitted to the outputs 124 and 128 respectfully and the signals from signal means 139 and 140 and 151 and 152 of the second and third input differential circuits 135 and 150 respectively are to be prevented from appearing at the outputs 124 and 128. To achieve this the select signal sources 144 and 166 on the second and third switching circuits 141 and 171 respectively are raised, by suitable means, to a voltage higher than the voltage of the voltage reference source 167. Also select signal source 133 is lowered by suitable means to a voltage lower than voltage reference source 167. This causes transistors 131 and 132 in circuit 130 to turn off and the transistors 142 and 143 in circuit 141 and transistor 164 and 165 in circuit 171 to turn on. When this occurs the current flowing through transistor 162 and 163 and the current sources 134 and 168 switches from transistors 162 and 163 and now begins to flow through transistors 142 and 143 (circuit 141) and through transistors 164 and 165 (circuit 171) respectively. The currents flowing through these transistors 142, 143, 164 and 165 also flow through resistors 118, 129, 158 and 160 which lowers the potential at the bases of transistors 123, 127, 157 and 159 and at the collectors of transistors 136, 137, 153 and 154. This causes transistors 123, 127, 157 and 159 to turn off. Simultaneously with the turning off of transistors 131 and 132 signals are applied to the bases of transistors 111 and 112 from signal input means 119 and 100 respectfully. If it is assumed that the signal from signal source 119 is high transistor 111 turns on pulling down the base of transistor 122 and therefore the emitter of transistor 122 also goes low which is connected to output 124, thusly inversely replicating the level of the signal from source 119. Simultaneously, if the input signal from source 120 is low the transistor 112 turns off causing the voltage at the base of transistor 126 to rise and transistor 126 turns on causing the output 188 to rise towards voltage source 117 and thus inversely replicating at the output 128 the level of the signal from source 120. In this way the signal supplied to the differential input circuit 110 is replicated at the outputs of the multiplexer (i.e., outputs 124 and 128).

When it is desired that the input signals supplied to the second differential input circuit 135 is to appear at the output nodes 124 and 128 the following sequence occurs. The select source 144 is brought below the reference voltage source 167 and select sources 133 and 166 are raised above reference source 167 causing the emitter coupled circuits 130 and 171 to turn on and pull current through transistors 131, 132, 164 and 165 respectfully and through the resistors 115, 116, 158 and 160. This lowers the potential at the bases of transistors 122, 126, 158 and 160 respectfully causing these transistors to turn off. When transistors 122, 126, 158 and 160 turn off they prevent any differential input signals applied by sources 119 and 120 or from sources 151 and 152 appearing at the outputs 124 and 128. If, simultaneously, differential input signals from sources 139 and 140 (i.e., source 139 is high and source 140 is low) are applied to the differential input transistors 136 and 137, the transistor 123 turns off and transistor 127 turns on causing node 124 to go low and node 128 to go high. Thus, node 124 and 128 now replicate the differential input signals applied by sources 140 and 139.

When it is desired that the input signals supplied to the third differential input circuit 150 is to appear at the output nodes 124 and 128 the following sequence occurs. The input select source 166 is brought below the reference source 167 and select sources 133 and 144 are brought above reference source 167, causing the current passing through the current sources 134 and 169 to flow through transistors 131, 132, 142 and 143 respectfully and through the respective resistors 115, 116, 118 and 129. This lowers the potential at the bases of transistors 122 and 123, and 126 and 127 causing these transistors to turn off. When transistors 122 and 123 and 126 and 127 turn off they prevent any differential input signals applied by sources 119 and 120 and sources 139 and 140 from appearing at the outputs 124 and 128.

If, simultaneously, differential input signals from sources 151 and 152 (i.e., source 151 is high and source 152 is low) are applied to the differential input transistors 153 and 154, the transistor 159 turns on and transistor 157 turns off causing node 124 to go low and node 128 to go high. Thus, nodes 124 and 128 replicate the differential input signals applied by sources 152 and 153. In this way the differential input signal applied to the different differential input circuits 110, 135 and 150 can be selectively propagated to the outputs 124 and 128.

These circuits are particularly applicable for use of clock driver chips and in other areas where high performance analog signal multiplexer is required.

The present invention thus uses a control signal for switching output stages and provides isolation between the switching and input signals while simultaneously facilitating switching high frequency signals rapidly. The outputs of the circuits are available at transistor emitters which provide low impedance drive, and can be cascaded to form multiplexers for more than two signals.

It should be obvious to one skilled in the art that such an arrangement can be created using either pnp or npn transistors or a combination of both as well as field effect transistor arrangements.

As will be readily discovered by one skilled in the art the circuit can be used in developing high performance analog chips, test equipment, interface equipment, communications equipment and other applications in analog circuit design.

It is therefore requested that the present invention be limited only by the appended claims wherein I claim.

What is claimed:

1. A signal section circuit for selecting one set of differential signals from a multiplicity of sets of differential signals comprising;
   a pair of differential output circuits each circuit comprising a pair of output transistors each transistor having a respective input,
   a plurality of differential input circuits coupled to said output circuits, each of said input circuits producing a respective set of differential signals,
   a plurality of switching circuit means coupled to said output circuits for permitting only one set of said multiplicity of sets of differential signals to be propagated to said output circuits by providing different selection voltages to each of said respective inputs of the output transistors.

2. The signal selection circuit of claim 1 wherein the number of said switching circuits is equal to the number of said differential input circuits.

3. The signal selection circuit of claim 2 wherein each of said differential input circuits are further coupled to a respective pair of input signal means.

4. The signal section circuit of claim 3 wherein there are at least two output circuits, each output circuit comprising a pair of output transistors each having a respective input and each of said differential input circuits comprise a pair of bipolar transistors having their emitters coupled to each other and to a common current source and their collectors coupled to respective inputs of the output circuits and through respective resistors to a power supply.

5. The signal selection circuit of claim 4 wherein each of said switching circuits comprise at least a pair of bipolar transistors having their emitters coupled to each other and to a common current source, their bases coupled to each other and to a respective voltage source and their collectors coupled to respective inputs of the output circuits.

6. The circuit of claim 3 wherein there are at least three differential input circuits coupled to said output circuits and each of said switching circuits comprise at least three bipolar transistors having their emitters coupled to a common current source, two of said transistors having their bases coupled together and to a selected voltage source, said two transistors having their collectors coupled across a respective one of said differential input circuits and to a respective output circuit, said third transistor in said switching circuit having its base coupled to a second voltage source.

7. The circuit of claim 6 wherein each switching circuit is coupled to a different selected voltage source and each said second voltage source may be set at a level higher or lower than said reference voltage source.

* * * * *

UNITED STATES PATENT AND TRADEMARK OFFICE
CERTIFICATE OF CORRECTION

PATENT NO. : 4,833,421
DATED : May 23, 1989
INVENTOR(S) : Charles W. Hanson

It is certified that error appears in the above-identified patent and that said Letters Patent is hereby corrected as shown below:

IN THE SPECIFICATION:

| | |
|---|---|
| Column 1, Line 10 | Delete "deferential" and change to --differential--. |
| Column 4, Line 58 | Delete "an" and change to --and--. |
| Column 5, Line 37 | Delete "100" and change to --120--. |
| Column 5, Line 46 | Delete "188" and change to --128--. |

IN THE CLAIMS:

| | |
|---|---|
| Claim 1, Line 1 | Delete "section" and change to --selection--. |
| Claim 4, Line 1 | Delete "section" and change to --selection--. |

Signed and Sealed this

Sixth Day of March, 1990

*Attest:*

JEFFREY M. SAMUELS

*Attesting Officer*    *Acting Commissioner of Patents and Trademarks*